US009209383B2

(12) United States Patent
Osawa et al.

(10) Patent No.: US 9,209,383 B2
(45) Date of Patent: Dec. 8, 2015

(54) VIBRATOR, VIBRATING DEVICE, AND ELECTRONIC APPARATUS

(71) Applicant: Seiko Epson Corporation, Tokyo (JP)

(72) Inventors: Seiji Osawa, Minowa (JP); Keiichi Yamaguchi, Ina (JP); Toshihiko Shiohara, Shiojiri (JP); Yuichi Isono, Azumino (JP); Takayuki Kikuchi, Okaya (JP)

(73) Assignee: Seiko Epson Corporation (JP)

( * ) Notice: Subject to any disclaimer, the term of this patent is extended or adjusted under 35 U.S.C. 154(b) by 454 days.

(21) Appl. No.: 13/675,232

(22) Filed: Nov. 13, 2012

(65) Prior Publication Data

US 2013/0127301 A1 May 23, 2013

(30) Foreign Application Priority Data

Nov. 16, 2011 (JP) .................. 2011-251038

(51) Int. Cl.
  *G01F 1/20* (2006.01)
  *H01L 41/09* (2006.01)
  *G01F 1/66* (2006.01)
  *G01C 19/5607* (2012.01)

(52) U.S. Cl.
  CPC ............ *H01L 41/09* (2013.01); *G01C 19/5607* (2013.01); *G01F 1/662* (2013.01)

(58) Field of Classification Search
  CPC ....... H01L 41/083; H01L 41/047; G01F 1/10; G01F 1/8454
  USPC .................. 73/861.18, 861, 861.34, 861.355, 73/861.354; 310/366, 365
  See application file for complete search history.

(56) References Cited

U.S. PATENT DOCUMENTS

| 5,392,650 | A  | 2/1995  | O'Brien et al.  |
| 5,635,647 | A  | 6/1997  | Heinouchi       |
| 5,757,107 | A  | 5/1998  | Wakatuki et al. |
| 6,244,110 | B1 | 6/2001  | Takeuchi et al. |
| 6,668,649 | B2 | 12/2003 | Ishitoko et al. |
| 6,799,461 | B2 | 10/2004 | Fujimoto et al. |

(Continued)

FOREIGN PATENT DOCUMENTS

| JP | 07-306048     |   | 11/1995 |
| JP | 2002-005664   |   | 1/2002  |
| JP | 2004-112843   | A | 4/2004  |
| JP | 2006-258505   |   | 9/2006  |
| JP | 2010-256332   |   | 11/2010 |
| JP | 2011-112480   | A | 6/2011  |

OTHER PUBLICATIONS

Kuramoto JP 2006-258505 Ogura JP 2010-256332.*

(Continued)

*Primary Examiner* — Lisa Caputo
*Assistant Examiner* — Nigel Plumb
(74) *Attorney, Agent, or Firm* — Harness, Dickey & Pierce, P.L.C.

(57) ABSTRACT

A vibrator includes: a vibrating reed having a vibrating body, first and second support portions supporting the vibrating body, and four beams coupling the first and second support portions with the vibrating body; electrodes disposed at the vibrating body; and terminals disposed at the first and second support portions and electrically connected with the electrodes via wires disposed at the beams. Between the terminals next to each other, a plurality of grooves spaced apart in a predetermined direction and extending in a direction intersecting the predetermined direction are disposed.

17 Claims, 7 Drawing Sheets

(56) References Cited

U.S. PATENT DOCUMENTS

| | | | |
|---|---|---|---|
| 7,164,179 B2 | 1/2007 | Nakanishi et al. | |
| 7,526,852 B2 | 5/2009 | Fujimoto et al. | |
| 7,639,096 B2 | 12/2009 | Ikeda et al. | |
| 7,999,637 B2 * | 8/2011 | Yamada | 333/200 |
| 2006/0070442 A1 * | 4/2006 | Kawauchi et al. | 73/504.12 |

OTHER PUBLICATIONS

Kuramoto, JP 2006-258505, Tuning fork vibrator for vibrating gyroscope Ogura, JP 2010-256332, Vibrating Reed, Vibrator and physical quantity detector.*

* cited by examiner

VIBRATOR, VIBRATING DEVICE, AND ELECTRONIC APPARATUS

BACKGROUND

1. Technical Field

The present invention relates to a vibrator, a vibrating device, and an electronic apparatus.

2. Related Art

Heretofore, as a vibrating reed for detecting an angular velocity, a so-called "WT-type" gyro element has been known (refer to JP-A-2010-256332 (Patent Document 1)).

The gyro element of Patent Document 1 has a vibrating body, first and second support portions supporting the vibrating body, first and second beams coupling the vibrating body with the first support portion, and third and fourth beams coupling the vibrating body with the second support portion. The vibrating body is composed of a base portion, first and second detecting vibration arms each extending outwardly from the base portion along the y-axis, first and second coupling arms each extending outwardly from the base portion along the x-axis, first and second driving vibration arms each extending outwardly from a tip portion of the first coupling arm along the y-axis, and third and fourth driving vibration arms each extending outwardly from a tip portion of the second coupling arm along the y-axis.

Moreover, in the gyro element of Patent Document 1, first and second detecting electrodes are disposed at the first and second detecting vibration arms, and first, second, third, and fourth driving electrodes are disposed at the first, second, third, and fourth driving vibration arms. The first detecting electrode and the first and second driving electrodes are extracted to the first support portion via the first and second beams and electrically connected to three connecting terminals disposed at the first support portion. Similarly to this, the second detecting electrode and the third and fourth driving electrodes are extracted to the second support portion via the third and fourth beams and electrically connected to three connecting terminals disposed at the second support portion.

The gyro element of Patent Document 1 is mounted on a mounting substrate via conductive adhesive. Specifically, each of the six connecting terminals and the mounting substrate are bonded together with the conductive adhesive, whereby the gyro element is fixed to the mounting substrate, and the gyro element and the mounting substrate are electrically connected.

The three connecting terminals disposed at the first support portion are disposed along the x-axis direction in a side-by-side arrangement. Therefore, when, for example, the application position or application amount of the conductive adhesive is shifted, or the alignment of the gyro element relative to the mounting substrate is shifted, the conductive adhesive contacts a connecting terminal other than the corresponding connecting terminal, or the conductive adhesives next to each other contact each other, causing a risk that the gyro element is not driven properly. That is, the gyro element of Patent Document 1 has a problem that the gyro element which is driven properly is not obtained unless the application position or application amount of the conductive adhesive and the alignment of the gyro element are accurately controlled.

SUMMARY

An advantage of some aspects of the invention is to provide a vibrator and a vibrating device both of which can prevent, in mounting on a mounting substrate, the contact of conductive fixing members with each other to perform proper driving.

The invention can be implemented as the following forms or application examples.

Application Example 1

This application example of the invention is directed to a vibrator including: a vibrating reed including a vibrating body, a support portion supporting the vibrating body, and a beam coupling the support portion with the vibrating body; at least two electrodes disposed at the vibrating body; and at least two terminals disposed at the support portion and electrically connected with the electrodes via a wire disposed at the beam, wherein the two terminals are arranged in parallel and spaced apart along a direction intersecting an extending direction of the beam, and a plurality of grooves spaced apart along the direction intersecting the extending direction of the beam and extending along the extending direction of the beam are disposed between the two terminals.

With this configuration, the vibrator can be fixed to a support substrate, and a plurality of conductive fixing members for establishing electrical continuity between electrodes (terminals) disposed at the support substrate and the electrodes disposed at the vibrator can be prevented from contacting each other. Therefore, the vibrator excellent in reliability can be provided.

Application Example 2

In the vibrator according to the application example of the invention, it is preferable that in the direction intersecting the extending direction of the beam, a connecting portion of the support portion with the beam is included in a region where the plurality of grooves are disposed.

The joining portion of the support portion with the beam is a portion on which stress is likely to concentrate. Therefore, by disposing the plurality of grooves so as to include the joining portion, the stress generated at the joining portion can be effectively absorbed or relieved by the plurality of grooves. Therefore, the damage of the vibrator can be effectively suppressed.

Application Example 3

In the vibrator according to the application example of the invention, it is preferable that at least one groove of the plurality of grooves is independently disposed.

With this configuration, since the conductive fixing members entered into the grooves can be prevented from contacting each other via the grooves, the contact of the conductive fixing members with each other can be prevented more reliably.

Application Example 4

In the vibrator according to the application example of the invention, it is preferable that ends of the plurality of grooves are opened in a side surface of the support portion, the ends being on the side opposite to the vibrating body.

With this configuration, the two terminals can be definitely separated from each other by the grooves. Therefore, it is possible, for example, to prevent the occurrence of such a problem that the conductive fixing members contact each other due to the running of the conductive fixing member through a region where the groove is not disposed.

Application Example 5

In the vibrator according to the application example of the invention, it is preferable that ends of the plurality of grooves are closed, the ends being on the side of the vibrating body.

With this configuration, the conductive fixing member flowed into the groove can be prevented from contacting the wire disposed at the beam.

Application Example 6

In the vibrator according to the application example of the invention, it is preferable that the ends of the plurality of grooves are spaced apart from an edge of the support portion, the ends and the edge being on the side of the vibrating body.

With this configuration, the conductive fixing member flowed into the groove can be prevented from contacting the wire disposed at the beam.

Application Example 7

In the vibrator according to the application example of the invention, it is preferable that a spaced apart distance between the ends of the grooves and the edge of the support portion is from 3 μm to 35 μm, the ends and the edge being on the side of the vibrating body.

With this configuration, the conductive fixing member flowed into the groove can be prevented from contacting the wire disposed at the beam. In addition, the two terminals can be definitely separated from each other by the grooves. Therefore, it is possible, for example, to prevent the occurrence of such a problem that the conductive fixing members contact each other due to the running of the conductive fixing member through a region where the groove is not disposed.

Application Example 8

In the vibrator according to the application example of the invention, it is preferable that an end of at least one groove of the plurality of grooves is opened in a side surface of the first support portion, the end being on the side of the vibrating body.

With this configuration, the two terminals can be definitely separated from each other by the grooves. Therefore, it is possible, for example, to prevent the occurrence of such a problem that the conductive fixing members contact each other due to the running of the conductive fixing member through a region where the groove is not disposed.

Application Example 9

In the vibrator according to the application example of the invention, it is preferable that an end of at least one groove of the plurality of grooves is in contact with the wire connected with one of the terminals, the end being on the side of the vibrating body, the at least one groove being located on the side of the one terminal, and that an end of at least one groove is in contact with the wire connected with the other terminal, the end being on the side of the vibrating body, the at least one groove being located on the side of the other terminal.

With this configuration, a short circuit can be prevented.

Application Example 10

In the vibrator according to the application example of the invention, it is preferable that the vibrating body includes a base portion, a first detecting vibration arm and a second detecting vibration arm each extending outwardly from the base portion along a first direction, a first coupling arm and a second coupling arm each extending outwardly from the base portion along a second direction perpendicular to the first direction, a first driving vibration arm and a second driving vibration arm each extending outwardly from the first coupling arm along the first direction, and a third driving vibration arm and a fourth driving vibration arm each extending outwardly from the second coupling arm along the first direction, the first detecting vibration arm and the second detecting vibration arm constituting a detecting vibration system, the first driving vibration arm, the second driving vibration arm, the third driving vibration arm, and the fourth driving vibration arm constituting a driving vibration system, that the support portion includes a first support portion and a second support portion extending in the second direction and arranged to face each other along the first direction with the vibrating body interposed therebetween, that the beam has a first beam passing between the first detecting vibration arm and the first driving vibration arm to couple the first support portion with the base portion, a second beam passing between the first detecting vibration arm and the third driving vibration arm to couple the first support portion with the base portion, a third beam passing between the second detecting vibration arm and the second driving vibration arm to couple the second support portion with the base portion, and a fourth beam passing between the second detecting vibration arm and the fourth driving vibration arm to couple the second support portion with the base portion, that the electrodes include a first detecting signal electrode, a second detecting signal electrode, a first detecting ground electrode, and a second detecting ground electrode disposed in the detecting vibration system, and a driving signal electrode and a driving ground electrode disposed in the driving vibration system, and that the terminals include a first detecting signal terminal connected with the first detecting signal electrode, a second detecting signal terminal connected with the second detecting signal electrode, a first detecting ground terminal connected with the first detecting ground electrode, a second detecting ground terminal connected with the second detecting ground electrode, a driving signal terminal connected with the driving signal electrode, and a driving ground terminal connected with the driving ground electrode.

With this configuration, an angular velocity can be detected by the vibrator.

Application Example 11

This application example of the invention is directed to a vibrating device including: a substrate including at least two connection pads; and the vibrator according to the application example of the invention, wherein the connection pad and the terminal are bonded together by a conductive fixing member.

With this configuration, the vibrating device with high reliability can be provided.

Application Example 12

In the vibrating device according to the application example of the invention, it is preferable that in a plan view of the substrate, the outline of the connection pad and a portion of a region where the plurality of grooves are disposed overlap each other.

With this configuration, since the plurality of grooves can be used as a scale (mark), the positioning relative to the substrate can be performed more accurately.

Application Example 13

This application example of the invention is directed to an electronic apparatus including the vibrator according to the application example of the invention.

With this configuration, the electronic apparatus with high reliability can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, vibrators and vibrating devices of the invention will be described in detail based on embodiments shown in the accompanying drawings.

First Embodiment

First, a first embodiment of a vibrating device (the vibrating device of the invention) to which the vibrator of the invention is applied will be described.

Figure 1A:
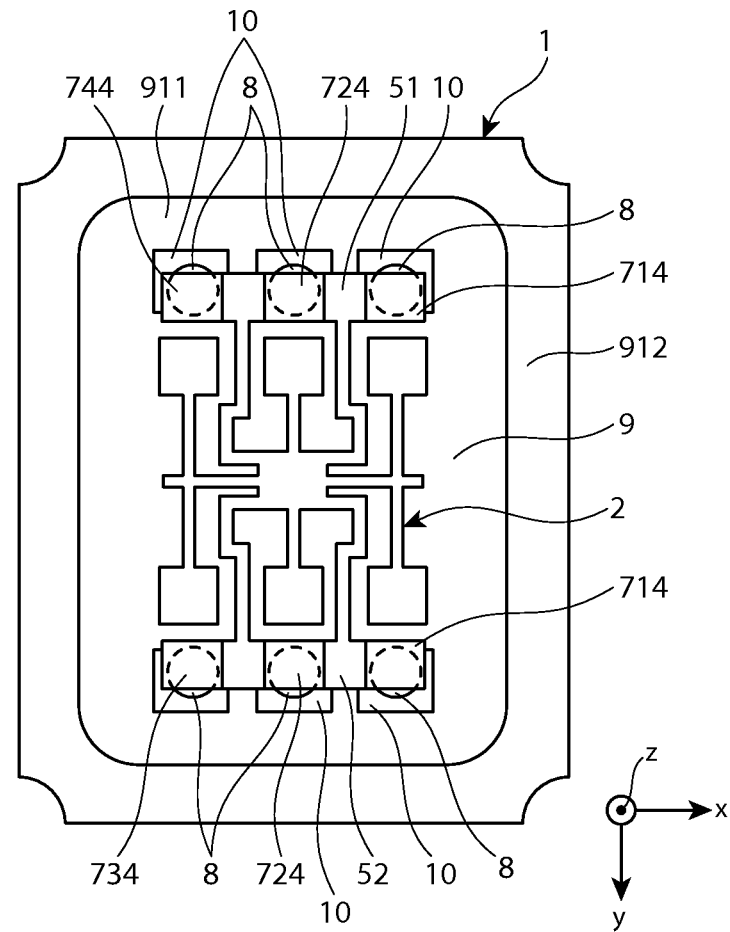
FIGS. 1A and 1B are diagrams (a plan view and a cross-sectional view, respectively) showing a first embodiment of a vibrating device of the invention.
Figure 1B:
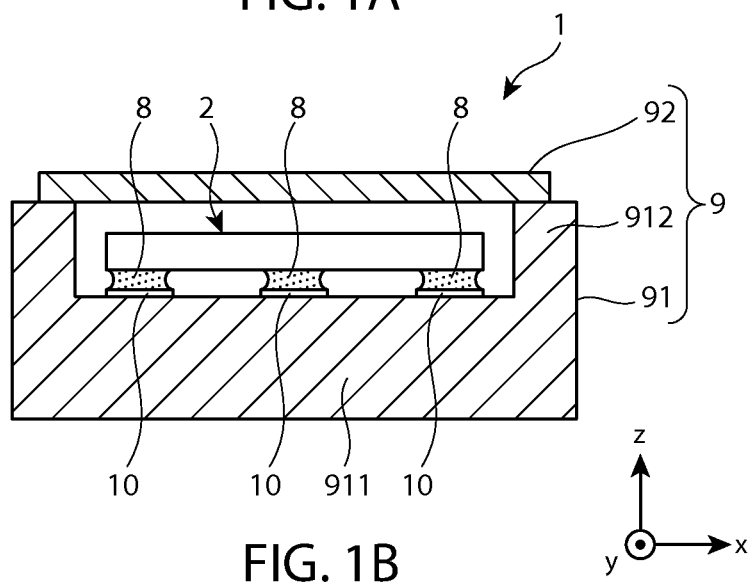
Figure 2:
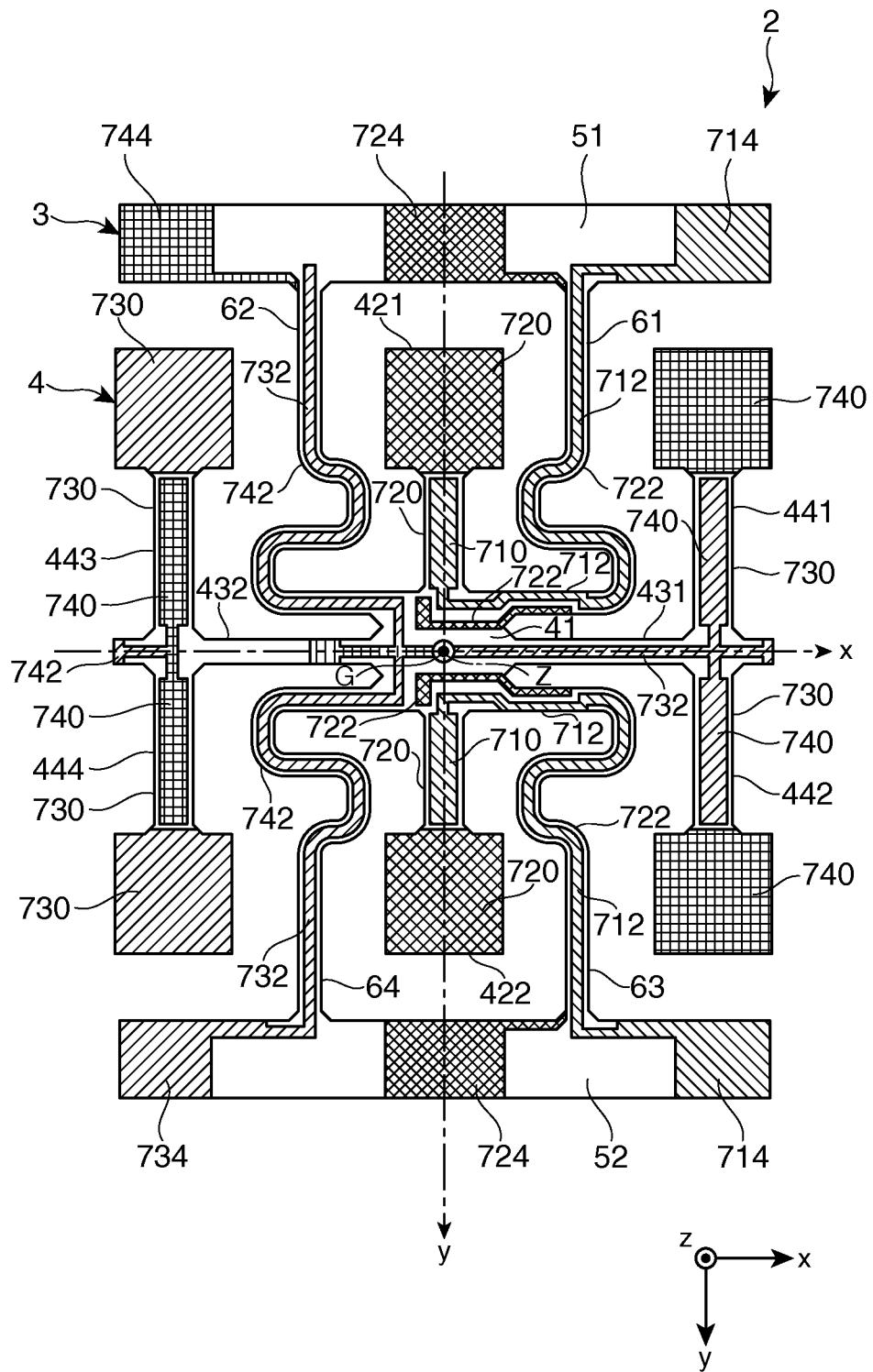
FIG. 2 is a plan view of a gyro element included in the vibrating device shown in FIGS. 1A and 1B.
Figure 3:
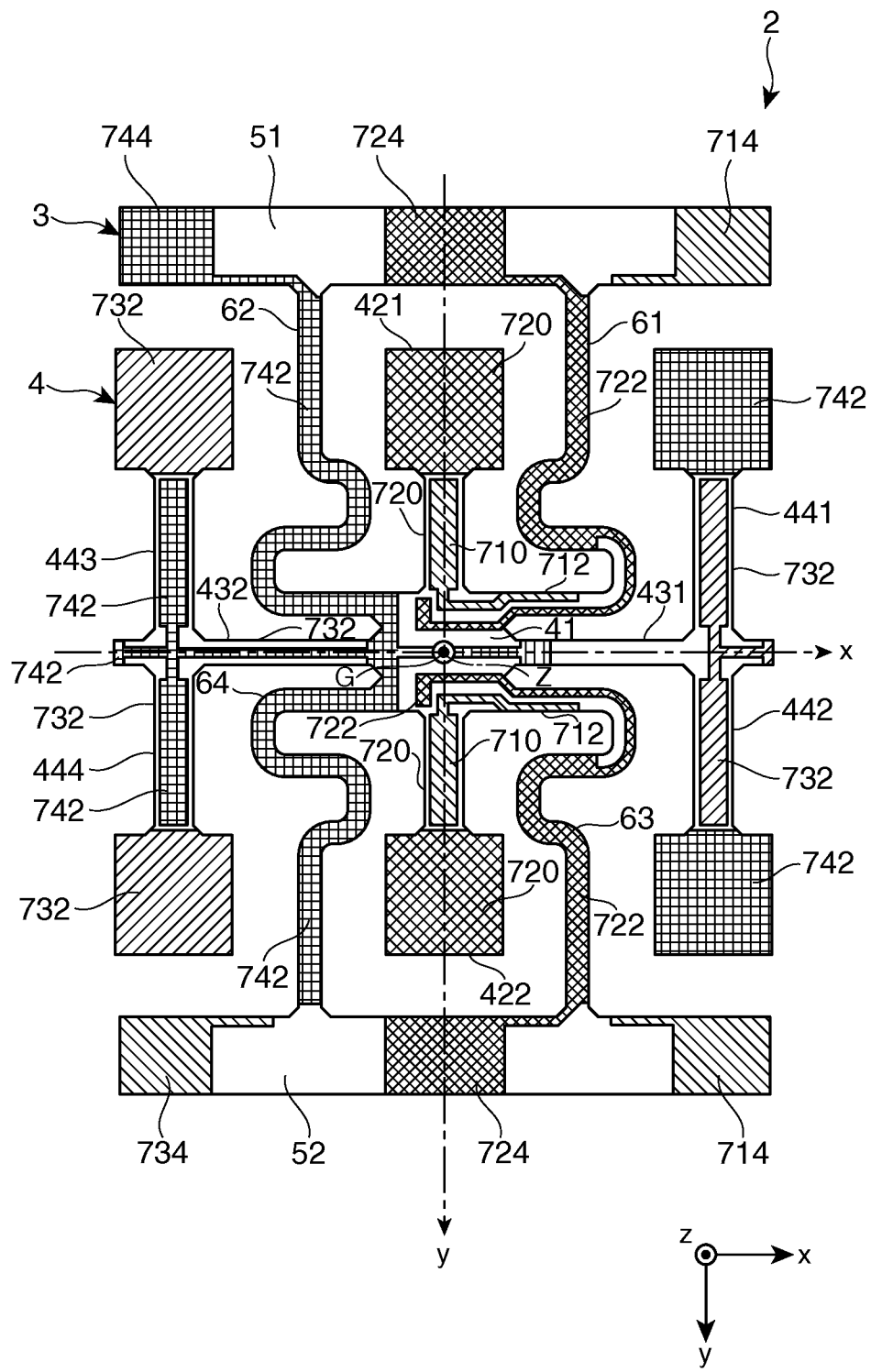
FIG. 3 is a plan view of the gyro element included in the vibrating device shown in FIGS. 1A and 1B.
Figure 4:
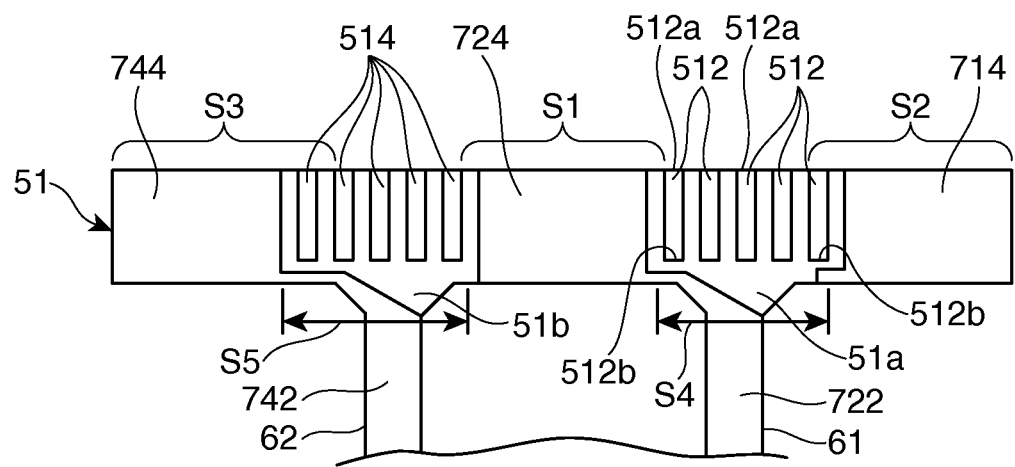
FIG. 4 is a partially enlarged view of the gyro element shown in FIG. 3.
Figure 4:
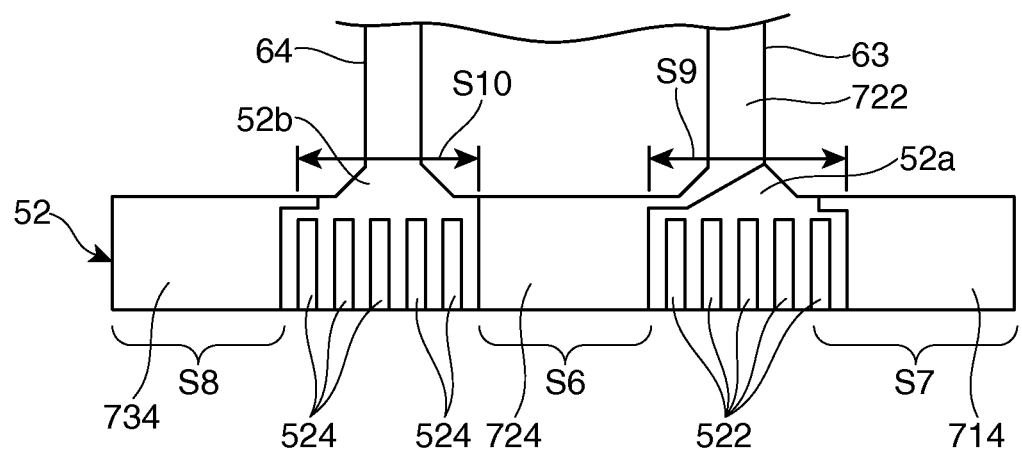
Figure 5B:
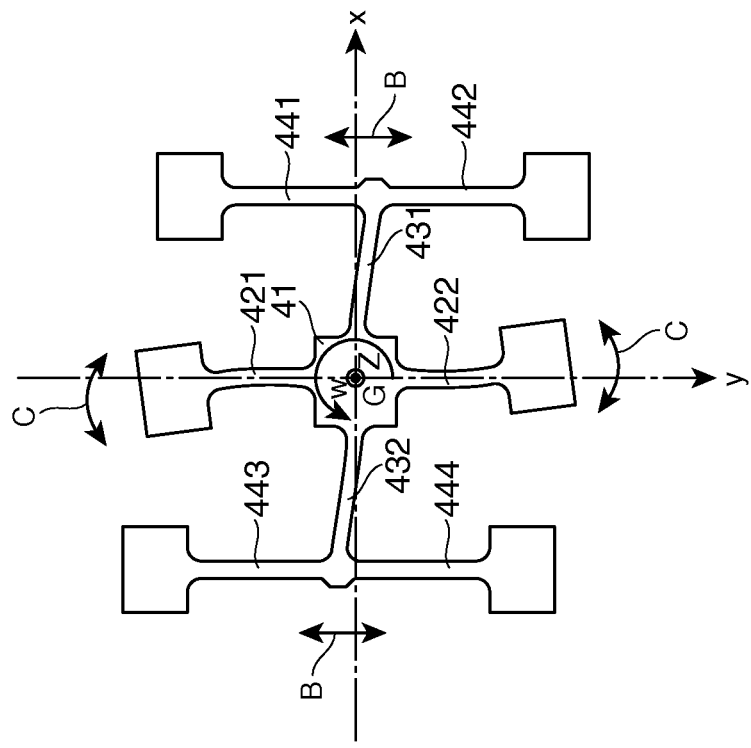
FIGS. 5A and 5B are plan views explaining the driving of the gyro element shown in FIG. 2.
Figure 5A:
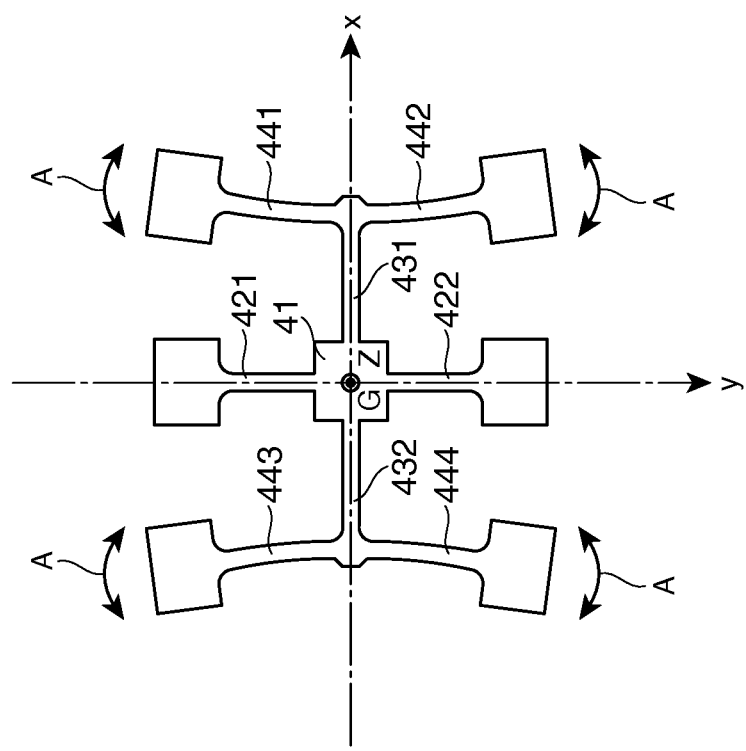
Figure 6:
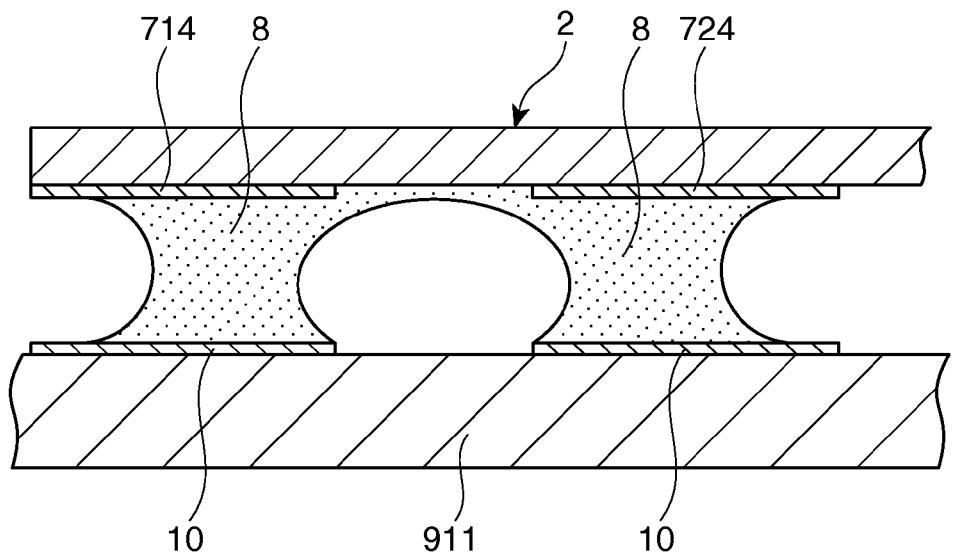
FIG. 6 is a cross-sectional view showing a problem of a related-art gyro element.
Figure 7:
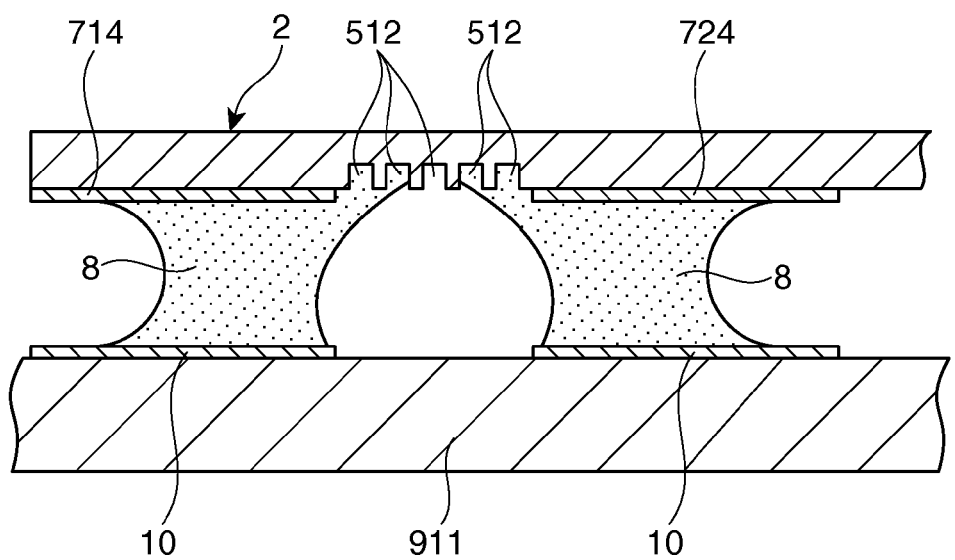
FIG. 7 is a cross-sectional view for explaining advantageous effects of the gyro element shown in FIG. 4.

FIGS. 1A and 1B are diagrams (a plan view and a cross-sectional view, respectively) showing the first embodiment of the vibrating device of the invention; FIGS. 2 and 3 are plan views of a gyro element included in the vibrating device shown in FIGS. 1A and 1B; FIG. 4 is a partially enlarged view of the gyro element shown in FIG. 3; FIGS. 5A and 5B are plan views explaining the driving of the gyro element shown in FIG. 2; FIG. 6 is a cross-sectional view showing a problem of a related-art gyro element; and FIG. 7 is a cross-sectional view for explaining advantageous effects of the gyro element shown in FIG. 4. In the following, as shown in FIGS. 1A and 1B, three axes perpendicular to each other are referred to as the x-axis, the y-axis, and the z-axis. The z-axis coincides with the thickness direction of the vibrating device. Moreover, a direction parallel to the x-axis is referred to as "x-axis direction (second direction)"; a direction parallel to the y-axis is referred to as "y-axis direction (first direction)"; and a direction parallel to the z-axis is referred to as "z-axis direction".

The vibrating device 1 shown in FIGS. 1A and 1B has a gyro element (vibrator) 2 and a package 9 accommodating the gyro element 2. Hereinafter, the gyro element 2 and the package 9 will be successively described in detail.

Gyro Element 2

FIG. 2 is a top view of the gyro element seen from above (the side of a lid 92); and FIG. 3 is a bottom view (perspective view) of the gyro element seen from above. In FIGS. 2 and 3, electrodes and terminals are hatched for convenience of description. Moreover, in FIGS. 2 and 3, the electrode and terminal indicated by the same hatching are electrically connected. In FIG. 4, the illustration of support portions, beams, electrodes, and the like are omitted for convenience of description.

The gyro element 2 is an "in-plane detection-type" sensor which detects an angular velocity about the z-axis, and includes a vibrating reed 3, and a plurality of electrodes, a plurality of wires, and a plurality of terminals disposed on the surface of the vibrating reed 3 as shown in FIGS. 2 and 3.

The vibrating reed 3 can be composed of a piezoelectric material such as quartz crystal, lithium tantalate, or lithium niobate, and quartz crystal is preferable among them. With this configuration, the vibrating reed 3 which can exhibit excellent vibration characteristics (frequency characteristics) is obtained.

The vibrating reed 3 has a vibrating body 4 of a so-called double-T type, first and second support portions 51 and 52 supporting the vibrating body 4, and first, second, third, and fourth beams 61, 62, 63, and 64 coupling the vibrating body 4 with the first and second support portions 51 and 52.

The vibrating body 4 extends in the xy plane and has a thickness in the z-axis direction. The vibrating body 4 has a base portion 41 located at the center, first and second detecting vibration arms 421 and 422 each extending outwardly from the base portion 41 along the y-axis direction, first and second coupling arms 431 and 432 each extending outwardly from the base portion 41 along the x-axis direction, first and second driving vibration arms 441 and 442 each extending outwardly from a tip portion of the first coupling arm 431 along the y-axis direction, and third and fourth driving vibration arms 443 and 444 each extending outwardly from a tip portion of the second coupling arm 432 along the y-axis direction. At each of tip portions of the first and second detecting vibration arms 421 and 422 and the first, second, third, and fourth driving vibration arms 441, 442, 443, and 444, a weight portion (hammerhead) which is substantially quadrilateral and has a width greater than that of the base-end side is disposed. By disposing the weight portion, detection sensitivity of the gyro element 2 for angular velocity is improved. In the following, this weight portion is also referred to as "tip portion".

The first and second driving vibration arms 441 and 442 may extend from the middle of the first coupling arm 431 in the extending direction. Similarly, the third and fourth driving vibration arms 443 and 444 may extend from the middle of the second coupling arm 432 in the extending direction.

The first and second support portions 51 and 52 each extend along the x-axis direction. The vibrating body 4 is located between these first and second support portions 51 and 52. In other words, the first and second support portions 51 and 52 are arranged so as to face each other along the y-axis direction via the vibrating body 4. The first support portion 51 is coupled with the base portion 41 via the first and second beams 61 and 62, while the second support portion 52 is coupled with the base portion 41 via the third and fourth beams 63 and 64.

The first beam 61 passes between the first detecting vibration arm 421 and the first driving vibration arm 441 to couple the first support portion 51 with the base portion 41. The second beam 62 passes between the first detecting vibration arm 421 and the third driving vibration arm 443 to couple the first support portion 51 with the base portion 41. The third beam 63 passes between the second detecting vibration arm 422 and the second driving vibration arm 442 to couple the second support portion 52 with the base portion 41. The fourth beam 64 passes between the second detecting vibration arm 422 and the fourth driving vibration arm 444 to couple the second support portion 52 with the base portion 41.

Each of the beams 61, 62, 63, and 64 has a serpentine portion (S-shaped portion) extending along the y-axis direction while reciprocating along the x-axis direction, and has elasticity in the x-axis direction and the y-axis direction. Moreover, each of the beams 61, 62, 63, and 64 has an elongated shape with the serpentine portion, and therefore has elasticity in all directions. Therefore, even when an impact is applied from the outside, detection noises caused by this impact can be reduced or suppressed because each of the beams 61, 62, 63, and 64 has a function of absorbing the impact.

The configuration of the vibrating reed 3 has been described above. In the vibrating reed 3 as shown in FIGS. 2 and 3, detecting signal electrodes 710, detecting signal wires 712, detecting signal terminals 714, detecting ground electrodes 720, detecting ground wires 722, detecting ground terminals 724, driving signal electrodes 730, driving signal wires 732, a driving signal terminal 734, driving ground electrodes 740, driving ground wires 742, and a driving ground terminal 744 are disposed.

For convenience sake, in FIGS. 2 and 3, the detecting signal electrode 710, the detecting signal wire 712, and the detecting signal terminal 714 are indicated by top-left to bottom-right hatching; the detecting ground electrode 720, the detecting ground wire 722, and the detecting ground terminal 724 are indicated by cross-hatching; the driving signal electrode 730, the driving signal wire 732, and the driving signal terminal 734 are indicated by top-right to bottom-left hatching; and the driving ground electrode 740, the driving ground wire 742, and the driving ground terminal 744 are indicated by vertical and horizontal cross-hatching. Moreover, in FIGS. 2 and 3, electrodes, wires, and terminals disposed on the side surfaces of the vibrating reed 3 are shown by heavy lines.

The electrodes 710, 720, 730, and 740, the wires 712, 722, 732, and 742, and the terminals 714, 724, 734, and 744 can be configured by, for example, stacking an under layer composed of chromium and an electrode layer composed of gold. With this configuration, the electrodes 710, 720, 730, and 740, the wires 712, 722, 732, and 742, and the terminals 714, 724, 734, and 744, all of which have good adhesion, can be formed.

The electrodes 710, 720, 730, and 740 are electrically separated from each other. Similarly to this, the wires 712, 722, 732, and 742 are electrically separated from each other. Also the terminals 714, 724, 734, and 744 are electrically separated from each other. Hereinafter, the electrodes, the wires, and the terminals will be successively described. In the following, the surface shown in FIG. 2 is referred to as "upper surface"; the surface shown in FIG. 3 is referred to as "lower surface"; and a surface connecting the upper surface with the lower surface is referred to as "side surface" for convenience of description.

1. Detecting Signal Electrode, Detecting Signal Wire, and Detecting Signal Terminal The detecting signal electrode 710 is disposed on the upper and lower surfaces of each of the first and second detecting vibration arms 421 and 422. In the embodiment, however, the detecting signal electrode 710 is not disposed at the tip portion of each of the first and second detecting vibration arms 421 and 422. The detecting signal electrodes 710 are arranged plane-symmetrically with respect to the xz plane. The detecting signal electrode 710 is an electrode for detecting, when detecting vibrations of the first and second detecting vibration arms 421 and 422 are excited, the strain of a piezoelectric material caused by the detecting vibrations.

The detecting signal wire 712 is disposed at the first and third beams 61 and 63. More specifically, the detecting signal wire 712 is disposed on the upper surface of each of the first and third beams 61 and 63. Further, the detecting signal wire 712 is also disposed on the side surface of a joining portion of the first support portion 51 with the first beam 61, on the side surface of a joining portion of the second support portion 52 with the third beam 63, and on the upper and lower surfaces of the base portion 41. The detecting signal wires 712 are arranged plane-symmetrically with respect to the xy plane.

The detecting signal terminal 714 is disposed at the first and second support portions 51 and 52. More specifically, the detecting signal terminal 714 is disposed on the upper, lower, and side surfaces of each of the first and second support portions 51 and 52. The detecting signal terminals 714 disposed on the upper, lower, and side surfaces of the first support portion 51 are electrically connected to each other. The detecting signal terminals 714 disposed on the upper, lower, and side surfaces of the second support portion 52 are electrically connected to each other.

The detecting signal terminal 714 disposed at the first support portion 51 is arranged on the side of the positive direction of the y-axis with respect to the tip portion of the first driving vibration arm 441 at which the driving ground electrode 740 is disposed. That is, the detecting signal terminal 714 disposed at the first support portion 51 and the driving ground electrode 740 disposed at the tip portion of the first driving vibration arm 441 face each other in the y-axis direction. The detecting signal terminal 714 disposed at the second support portion 52 is arranged on the side of the negative direction of the y-axis with respect to the tip portion of the second driving vibration arm 442 at which the driving ground electrode 740 is disposed. That is, the detecting signal terminal 714 disposed at the second support portion 52 and the driving ground electrode 740 disposed at the tip portion of the second driving vibration arm 442 face each other in the y-axis direction. The detecting signal terminals 714 are arranged plane-symmetrically with respect to the xz plane.

The detecting signal terminal (a first detecting signal terminal) 714 disposed at the first support portion 51 is electrically connected, via the detecting signal wire 712 disposed at the first beam 61, with the detecting signal electrode (a first detecting signal electrode) 710 disposed at the first detecting vibration arm 421. Specifically, the detecting signal terminal 714 disposed at the first support portion 51 is connected with the detecting signal wire 712 disposed on the upper surface of the first beam 61, and the detecting signal wire 712 is connected from the upper surface of the first beam 61 through the side surface of a connecting portion of the base portion 41 with the first beam 61 and the upper and lower surfaces of the base portion 41 to the detecting signal electrodes 710 disposed on the upper and lower surfaces of the first detecting vibration arm 421. With this configuration, a first detecting signal caused by vibration of the first detecting vibration arm 421 can be conducted from the detecting signal electrode 710 to the detecting signal terminal 714 disposed at the first support portion 51.

The detecting signal terminal (a second detecting signal terminal) 714 disposed at the second support portion 52 is electrically connected, via the detecting signal wire 712 disposed at the third beam 63, with the detecting signal electrode (a second detecting signal electrode) 710 disposed at the second detecting vibration arm 422. Specifically, the detecting signal terminal 714 disposed at the second support portion 52 is connected with the detecting signal wire 712 disposed on the upper surface of the third beam 63, and the detecting signal wire 712 is connected from the upper surface of the third beam 63 through the side surface of a connecting portion of the base portion 41 with the third beam 63 and the upper and lower surfaces of the base portion 41 to the detecting signal electrodes 710 disposed on the upper and lower surfaces of the second detecting vibration arm 422. With this configuration, a second detecting signal caused by vibration of the second detecting vibration arm 422 can be conducted from the detecting signal electrode 710 to the detecting signal terminal 714 disposed at the second support portion 52.

2. Detecting Ground Electrode, Detecting Ground Wire, and Detecting Ground Terminal The detecting ground electrode 720 is disposed at the tip portion of each of the first and second detecting vibration arms 421 and 422. Specifically, the detecting ground electrode 720 is disposed on the upper and lower surfaces of the tip portion of each of the first and second detecting vibration arms 421 and 422. Further, the detecting ground electrode 720 is disposed on the side surfaces of each of the first and second detecting vibration arms 421 and 422. The detecting ground electrodes 720 disposed on the upper, lower, and side surfaces of the first detecting vibration arm 421 are electrically connected to each other. The detecting ground electrodes 720 disposed on the upper, lower, and side surfaces of the second detecting vibration arm 422 are electrically connected to each other. The detecting ground electrodes 720 are arranged plane-symmetrically with respect to the xz plane. The detecting ground electrode 720 has a potential serving as a ground for the detecting signal electrode 710.

The detecting ground wire 722 is disposed at the first and third beams 61 and 63. Specifically, the detecting ground wire 722 is disposed on the lower and side surfaces of each of the first and third beams 61 and 63. Further, the detecting ground wire 722 is disposed on the upper and lower surfaces of the base portion 41. The detecting ground wires 722 are arranged plane-symmetrically with respect to the xz plane.

The detecting ground terminal 724 is disposed at the first and second support portions 51 and 52. Specifically, the detecting ground terminal 724 is disposed on the upper, lower, and side surfaces of each of the first and second support portions 51 and 52. The detecting ground terminals 724 disposed on the upper, lower, and side surfaces of the first support portion 51 are electrically connected to each other. The detecting ground terminals 724 disposed on the upper, lower, and side surfaces of the second support portion 52 are electrically connected to each other.

The detecting ground terminal 724 disposed at the first support portion 51 is arranged on the side of the positive direction of the y-axis with respect to the tip portion of the first detecting vibration arm 421 at which the detecting ground electrode 720 is disposed. That is, the detecting ground terminal 724 disposed at the first support portion 51 and the detecting ground electrode 720 disposed at the tip portion of the first detecting vibration arm 421 face each other in the y-axis direction. The detecting ground terminal 724 disposed at the second support portion 52 is arranged on the side of the negative direction of the y-axis with respect to the tip portion of the second detecting vibration arm 422 at which the detecting ground electrode 720 is disposed. That is, the detecting ground terminal 724 disposed at the second support portion 52 and the detecting ground electrode 720 disposed at the tip portion of the second detecting vibration arm 422 face each other in the y-axis direction. The detecting ground terminals 724 are arranged plane-symmetrically with respect to the xz plane.

The detecting ground terminal (a first detecting ground terminal) 724 disposed at the first support portion 51 is electrically connected, via the detecting ground wire 722 disposed at the first beam 61, with the detecting ground electrode (a first detecting ground electrode) 720 disposed at the first detecting vibration arm 421. Specifically, the detecting ground terminal 724 disposed at the first support portion 51 is connected with the detecting ground wire 722 disposed on the lower and side surfaces of the first beam 61, and the detecting ground wire 722 is connected from the lower and side surfaces of the first beam 61 through the upper and lower surfaces of the base portion 41 to the detecting ground electrodes 720 disposed on the upper and lower surfaces of the first detecting vibration arm 421.

The detecting ground terminal (a second detecting ground terminal) 724 disposed at the second support portion 52 is electrically connected, via the detecting ground wire 722 disposed at the third beam 63, with the detecting ground electrode (a second detecting ground electrode) 720 disposed at the second detecting vibration arm 422. Specifically, the detecting ground terminal 724 disposed at the second support portion 52 is connected with the detecting ground wire 722 disposed on the lower and side surfaces of the third beam 63, and the detecting ground wire 722 is connected from the lower and side surfaces of the third beam 63 through the upper and lower surfaces of the base portion 41 to the detecting ground electrodes 720 disposed on the upper and lower surfaces of the second detecting vibration arm 422.

The detecting signal electrodes, wires, and terminals 710, 712, and 714 and the detecting ground electrodes, wires, and terminals 720, 722, and 724 are arranged as described above. With this configuration, detecting vibration generated at the first detecting vibration arm 421 appears as an electric charge between the detecting signal electrode 710 and the detecting ground electrode 720 disposed at the first detecting vibration arm 421, so that the electric charge can be extracted as a signal from the detecting signal terminal 714 and the detecting ground terminal 724 disposed at the first support portion 51. Detecting vibration generated at the second detecting vibration arm 422 appears as an electric charge between the detecting signal electrode 710 and the detecting ground electrode 720 disposed at the second detecting vibration arm 422, so that the electric charge can be extracted as a signal from the detecting signal terminal 714 and the detecting ground terminal 724 disposed at the second support portion 52.

3. Driving Signal Electrode, Driving Signal Wire, and Driving Signal Terminal

The driving signal electrode 730 is disposed at the first and second driving vibration arms 441 and 442. In the embodiment, however, the driving signal electrode 730 is not disposed at the tip portion of each of the first and second driving vibration arms 441 and 442. Specifically, the driving signal electrode 730 is disposed on the upper and lower surfaces of each of the first and second driving vibration arms 441 and 442.

Further, the driving signal electrode 730 is also disposed on the side surfaces of each of the third and fourth driving vibration arms 443 and 444 and the upper and lower surfaces of the tip portion of each of the third and fourth driving vibration arms 443 and 444. The driving signal electrodes 730 disposed on the upper, lower, and side surfaces of the third driving vibration arm 443 are electrically connected to each other. The driving signal electrodes 730 disposed on the upper, lower, and side surfaces of the fourth driving vibration arm 444 are electrically connected to each other. The driving signal electrodes 730 are arranged plane-symmetrically with respect to the xz plane. The driving signal electrodes 730 are electrodes for exciting driving vibrations of the first, second, third, and fourth driving vibration arms 441, 442, 443, and 444.

The driving signal wire 732 is disposed at the second and fourth beams 62 and 64. Specifically, the driving signal wire 732 is disposed on the upper surface of each of the second and fourth beams 62 and 64. Further, the driving signal wire 732 is disposed on the upper surface of the base portion 41, the upper surface of the first coupling arm 431, and the side surfaces of each of the first and second coupling arms 431 and 432. The driving signal wires 732 are arranged plane-symmetrically with respect to the xz plane.

The driving signal terminal 734 is disposed at the second support portion 52. Specifically, the driving signal terminal 734 is disposed on the upper, lower, and side surfaces of the second support portion 52. The driving signal terminals 734 disposed on the upper, lower, and side surfaces of the second support portion 52 are electrically connected to each other.

The driving signal terminal 734 disposed at the second support portion 52 is arranged on the side of the negative direction of the y-axis with respect to the tip portion of the fourth driving vibration arm 444 at which the driving signal electrode 730 is disposed. That is, the driving signal terminal 734 disposed at the second support portion 52 and the driving signal electrode 730 disposed at the tip portion of the fourth driving vibration arm 444 face each other in the y-axis direction.

The driving signal terminal 734 disposed at the second support portion 52 is electrically connected, via the driving signal wire 732 disposed at the fourth beam 64, with the driving signal electrodes 730 disposed at the first, second, third, and fourth driving vibration arms 441, 442, 443, and 444. Specifically, the driving signal terminal 734 is connected with the driving signal wire 732 disposed on the upper surface of the fourth beam 64, and the driving signal wire 732 is connected from the upper surface of the fourth beam 64 through the upper surface of the base portion 41 and the upper surface of the first coupling arm 431 to the driving signal electrodes 730 disposed on the upper surfaces of the first and second driving vibration arms 441 and 442. Further, the driving signal wire 732 is connected from the upper surface of the first coupling arm 431 through the side surfaces of the first coupling arm 431 to the driving signal electrodes 730 disposed on the lower surfaces of the first and second driving vibration arms 441 and 442. Still further, the driving signal wire 732 can be connected from the upper surface of the base portion 41 through the upper and side surfaces of the second coupling arm 432 to the driving signal electrodes 730 disposed on the upper and lower surfaces of each of the third and fourth driving vibration arms 443 and 444. With this configuration, driving signals for drivingly vibrating the first, second, third, and fourth driving vibration arms 441, 442, 443, and 444 can be conducted from the driving signal terminal 734 to the driving signal electrodes 730.

4. Driving Ground Electrode, Driving Ground Wire, and Driving Ground Terminal

The driving ground electrode 740 is disposed at the tip portion of each of the first and second driving vibration arms 441 and 442. Specifically, the driving ground electrode 740 is disposed on the upper and lower surfaces of the tip portion of each of the first and second driving vibration arms 441 and 442. Further, the driving ground electrode 740 is also disposed on the side surfaces of each of the first and second driving vibration arms 441 and 442. The driving ground electrodes 740 disposed on the upper, lower, and side surfaces of the first driving vibration arm 441 are electrically connected to each other. The driving ground electrodes 740 disposed on the upper, lower, and side surfaces of the second driving vibration arm 442 are electrically connected to each other.

Further, the driving ground electrode 740 can be disposed on the upper and lower surfaces of each of the third and fourth driving vibration arms 443 and 444. In the embodiment, however, the driving ground electrode 740 is not disposed at the tip portion of each of the third and fourth driving vibration arms 443 and 444. The driving ground electrodes 740 are arranged plane-symmetrically with respect to the xz plane. The driving ground electrode 740 has a potential serving as a ground for the driving signal electrode 730.

The driving ground wire 742 is disposed at the second and fourth beams 62 and 64. Specifically, the driving ground wire 742 is disposed on the lower and side surfaces of each of the second and fourth beams 62 and 64. Further, the driving ground wire 742 is disposed on the lower surface of the base portion 41, the side surfaces of the first coupling arm 431, the lower surface of the second coupling arm 432, and the side surface of the second coupling arm 432. The driving ground wires 742 are arranged plane-symmetrically with respect to the xz plane.

The driving ground terminal 744 is disposed at the first support portion 51. Specifically, the driving ground terminal 744 is disposed on the upper, lower, and side surfaces of the first support portion 51. The driving ground terminals 744 disposed on the upper, lower, and side surfaces of the first support portion 51 are electrically connected to each other.

The driving ground terminal 744 disposed at the first support portion 51 is arranged on the side of the positive direction of the y-axis with respect to the tip portion of the third driving vibration arm 443 at which the driving signal electrode 730 is disposed. That is, the driving ground terminal 744 disposed at the first support portion 51 and the driving signal electrode 730 disposed at the tip portion of the third driving vibration arm 443 face each other in the y-axis direction.

Moreover, the driving ground terminal 744 disposed at the first support portion 51 is electrically connected, via the driving ground wire 742 disposed at the second beam 62, with the driving ground electrodes 740 disposed at the first, second, third, and fourth driving vibration arms 441, 442, 443, and 444. Specifically, the driving ground terminal 744 is connected with the driving ground wire 742 disposed on the lower and side surfaces of the second beam 62, and the driving ground wire 742 is connected from the lower and side surfaces of the second beam 62 through the lower surface of the base portion 41 and the side surfaces of the first coupling arm 431 to the driving ground electrodes 740 disposed on the upper and lower surfaces of each of the first and second driving vibration arms 441 and 442. Further, the driving ground wire 742 is connected from the lower surface of the base portion 41 through the lower and side surfaces of the second coupling arm 432 to the driving ground electrodes 740 disposed on the upper and lower surfaces of each of the third and fourth driving vibration arms 443 and 444.

The driving signal electrodes, wires, and terminals 730, 732, and 734 and the driving ground electrodes, wires, and terminals 740, 742, and 744 are arranged as described above. With this configuration, by applying a driving signal between the driving signal terminal 734 disposed at the second support portion 52 and the driving ground terminal 744 disposed at the first support portion 51, an electric field is generated between the driving signal electrode 730 and the driving ground electrode 740 disposed at each of the first, second, third, and fourth driving vibration arms 441, 442, 443, and 444, so that each of the driving vibration arms 441, 442, 443, and 444 can be drivingly vibrated.

As has been described above, the detecting signal terminal 714, the detecting ground terminal 724, and the driving ground terminal 744 are disposed along the x-axis direction in a side-by-side arrangement and spaced apart from each other at the first support portion 51. Specifically, as shown in FIG. 4, the detecting ground terminal 724 is disposed at a central portion (a region between a joining portion 51a with the first beam 61 and a joining portion 51b with the second beam 62) S1 of the first support portion 51 extending along the x-axis direction; the detecting signal terminal 714 is disposed at one end portion (a region to the right of the joining portion 51a in FIG. 4) S2 of the first support portion 51; and the driving ground terminal 744 is disposed at the other end portion (a region to the left of the joining portion 51b in FIG. 4) S3 of the first support portion 51.

A plurality of grooves 512 are disposed between the detecting signal terminal 714 and the detecting ground terminal 724 on the lower surface (surface to be applied with a conductive fixing member 8 which will be described later) of the first support portion 51. A region S4 where the plurality of grooves 512 are disposed includes the joining portion 51a in the x-axis direction.

The plurality of grooves 512 each extend in the y-axis direction and are disposed spaced apart from each other along the x-axis direction. That is, the plurality of grooves 512 are disposed independently of each other. As shown in FIG. 4, an end (end on the side opposite to the vibrating body 4) 512a of each of the grooves 512, the end being on the upper side of FIG. 4, is opened in the side surface of the first support portion 51, while an end (end on the side of the vibrating body 4) 512b on the lower side of FIG. 4 is not opened but closed in the side surface of the first support portion 51. In other words, the end 512b is spaced apart from the edge of the first support portion 51.

The position of the end 512b of each of the grooves 512 is preferably located as close as possible to the side of the vibrating body 4 as long as the groove 512 does not contact each of the wires 712 and 722 disposed at the joining portion 51a. Specifically, a spaced apart distance L between the end 512b and the side surface (edge) of the first support portion 51 is preferably, for example, from 3 μm to 35 μm.

The number of the grooves 512 is not particularly limited as long as the number is two or more. Although the number may be three, four, five, or more, the number is preferably five or more. With this configuration, advantageous effects described later are more remarkably provided.

The width of the groove 512 is not particularly limited but preferably from 20 μm to 30 μm. A spaced apart distance between the grooves 512 next to each other is not particularly limited but preferably from 10 μm to 20 μm. The depth of the groove 512 is not particularly limited but preferably from 10 μm to 40 μm. By forming the grooves 512 into the sizes and arrangement described above, the advantageous effects described later are more remarkably provided.

A plurality of grooves 514 are disposed between the driving ground terminal 744 and the detecting ground terminal 724 on the lower surface of the first support portion 51. A region S5 where the plurality of grooves 514 are disposed includes the joining portion 51b in the x-axis direction. The configuration of the plurality of grooves 514 is similar to that of the plurality of grooves 512 described above, and therefore the description thereof is omitted.

Similarly, the detecting signal terminal 714, the detecting ground terminal 724, and the driving signal terminal 734 are disposed along the x-axis direction in a side-by-side arrangement and spaced apart at the second support portion 52. Specifically, as shown in FIG. 4, the detecting ground terminal 724 is disposed at a central portion (a region between a joining portion 52a with the third beam 63 and a joining portion 52b with the fourth beam 64) S6 of the second support portion 52 extending along the x-axis direction; the detecting signal terminal 714 is disposed at one end portion (a region to the right of the joining portion 52a in FIG. 4) S7 of the second support portion 52; and the driving signal terminal 734 is disposed at the other end portion (a region to the left of the joining portion 52b in FIG. 4) S8 of the second support portion 52.

A plurality of grooves 522 are disposed between the detecting signal terminal 714 and the detecting ground terminal 724 on the lower surface of the second support portion 52. A region S9 where the plurality of grooves 522 are disposed includes the joining portion 52a in the x-axis direction. The configuration of the plurality of grooves 522 is similar to that of the plurality of grooves 512 described above, and therefore the description thereof is omitted.

A plurality of grooves 524 are disposed between the detecting ground terminal 724 and the driving signal terminal 734 on the lower surface of the second support portion 52. A region S10 where the plurality of grooves 524 are disposed includes the joining portion 52b in the x-axis direction. The configuration of the plurality of grooves 524 is similar to that of the plurality of grooves 512 described above, and therefore the description thereof is omitted.

The gyro element 2 having the configuration described above detects an angular velocity ω about the z-axis as follows. In the gyro element 2, when an electric field is generated between the driving signal electrode 730 and the driving ground electrode 740 in a state where the angular velocity ω is not applied, the driving vibration arms 441, 442, 443, and 444 perform bending vibration as shown in FIG. 5A in directions shown by double-headed arrows A. In this case, since the first and second driving vibration arms 441 and 442 and the third and fourth driving vibration arms 443 and 444 vibrate plane-symmetrically with respect to the yz plane passing through a central point G (center of gravity G), the base portion 41, the first and second coupling arms 431 and 432, and the first and second detecting vibration arms 421 and 422 hardly vibrate.

When the angular velocity ω about the z-axis is applied to the gyro element 2 in a state of performing this driving vibration, vibrations as shown in FIG. 5B are generated. That is, the Coriolis force in directions of double-headed arrows B acts on the driving vibration arms 441, 442, 443, and 444 and the coupling arms 431 and 432, and in response to vibrations in the directions of the double-headed arrows B, detecting vibrations in directions of double-headed arrows C are excited. Then, the strain of the detecting vibration arms 421 and 422 caused by the vibrations is detected by the detecting signal electrode 710 and the detecting ground electrode 720 to obtain the angular velocity ω.

Package

The package 9 accommodates the gyro element 2. In the package 9, an IC chip or the like which performs the driving or the like of the gyro element 2 may be accommodated in addition to the gyro element 2. The package 9 has, in its plan view (xy plan view), substantially a rectangular shape.

The package 9 has a base 91 having a recess which is opened in the upper surface and the lid 92 bonded to the base so as to cover an opening of the recess. The base 91 has a plate-like bottom plate 911 and a frame-like side wall 912 disposed at the circumferential edge portion of the upper surface of the bottom plate 911. The package 9 has an accommodating space S in the inside thereof. Within the accommodating space S, the gyro element 2 is air-tightly accommodated and installed.

The gyro element 2 is fixed, at the first and second support portions 51 and 52, to the upper surface of the bottom plate 911 via the conductive fixing members 8 such as solder, silver paste, or conductive adhesive (adhesive having conductive filler, such as metal particles, dispersed in a resin material). The first and second support portions 51 and 52 are located at both end portions of the gyro element 2 in the y-axis direction. Therefore, by fixing the first and second support portions 51 and 52 to the bottom plate 911, the vibrating body 4 of the gyro element 2 is supported at both ends, so that the gyro element 2 can be fixed stably to the bottom plate 911. Therefore, unwanted vibrations (vibrations other than those desired to be detected) of the gyro element 2 are suppressed, so that detection accuracy for the angular velocity ω by the gyro element 2 is improved.

Six conductive fixing members 8 are disposed spaced apart from each other and correspond to (contact) the two detecting signal terminals 714, the two detecting ground terminals 724, the driving signal terminal 734, and the driving ground terminal 744 disposed at the first and second support portions 51 and 52. On the upper surface of the bottom plate 911, six connection pads 10 corresponding to the two detecting signal terminals 714, the two detecting ground terminals 724, the driving signal terminal 734, and the driving ground terminal 744 are disposed. Each of the connection pads 10 and any of the terminals corresponding thereto are electrically connected via the conductive fixing member 8.

With the configuration described above, since the conductive fixing members 8 can be used as fixing members for fixing the gyro element 2 to the bottom plate 911 and can be used as connecting members for performing electrical connection with the gyro element 2, the configuration of the vibrating device 1 can be simplified.

Moreover, the conductive fixing members 8 form a gap between the gyro element 2 and the bottom plate 911 and therefore can be used as gap members for preventing the contact between them. With this configuration, the breakage and damage of the gyro element 2 due to contact with the bottom plate 911 can be prevented, so that the vibrating device 1 which can accurately detect an angular velocity and exhibit excellent reliability is provided.

Each of the connection pads 10 is extracted to the outside of the package 9 via a conductive post (not shown), or is electrically connected with, when an IC chip or the like is accommodated within the package 9, the IC chip.

The constituent material of the base 91 is not particularly limited, and various kinds of ceramics such as aluminum oxide can be used. The constituent material of the lid 92 is not particularly limited, but is desirably a member having a linear expansion coefficient close to that of the constituent material of the base 91. For example, when ceramics is used as the constituent material of the base 91 as described above, an alloy such as Kovar is preferably used. The bonding between the base 91 and the lid 92 is not particularly limited. For example, they may be bonded together via adhesive, or may be bonded together by seam-welding or the like.

As described above, the grooves 512 and 514 are disposed at the first support portion 51 of the gyro element 2, while the grooves 522 and 524 are disposed at the second support portion 52. By disposing the grooves 512, 514, 522, and 524, the following advantageous effects can be exhibited.

As described above, the gyro element 2 is fixed to the bottom plate 911 via the conductive fixing members 8. The process of fixing the gyro element 2 to the bottom plate 911 is performed as follows. For example, the silver paste (conductive fixing member) 8 is applied onto each of the six connection pads 10 disposed on the bottom plate 911; the gyro element 2 is placed and pressed with its lower surface being directed toward the bottom plate 911 such that the applied silver paste 8 and each of the corresponding terminals 714, 724, 734, and 744 are brought into contact with each other; and the silver paste is solidified. Thus, the gyro element 2 is fixed to the bottom plate 911 via the silver paste 8.

Therefore, when, for example, the silver paste 8 cannot be accurately applied at predetermined positions, the silver paste 8 wet-spreads in pressing the gyro element 2 as shown in FIG. 6 in a related-art gyro element (one obtained by excluding the grooves 512, 514, 522, and 524 from the gyro element 2), so that the wet-spread silver pastes 8 contact each other to cause a risk of short circuit between them. Since there is some degree of variation in the application position or application amount of the silver paste 8 in view of the accuracy of the device, the above-described problem is relatively likely to occur. Therefore, by disposing the grooves 512, 514, 522, and 524 at the first and second support portions 51 and 52 in the gyro element 2, the occurrence of the problem described above is prevented. Hereinafter, the description will be made specifically. Since the operations and advantageous effects of the grooves 512, 514, 522, and 524 are similar to each other, the groove 512 will be described as representative of the grooves.

As shown in FIG. 7, the silver pastes 8 corresponding to the detecting ground terminal 724 and the detecting signal terminal 714 wet-spread by pressing the gyro element 2. At this time, even when the application position of the silver paste 8 corresponding to the detecting ground terminal 724 is shifted toward the detecting signal terminal 714, the wet-spread silver paste 8 enters into the groove 512 (512a) of the plurality of grooves 512, the groove 512 (512a) being located on the side of the detecting ground terminal 724. Therefore, the silver paste 8 does not wet-spread further toward the detecting signal terminal 714. Similarly, even when the application position of the silver paste 8 corresponding to the detecting signal terminal 714 is shifted toward the detecting ground terminal 724, the wet-spread silver paste 8 enters into the groove 512 (512b) of the plurality of grooves 512, the groove 512 (512b) being located on the side of the detecting signal terminal 714. Therefore, the silver paste 8 does not wet-spread further toward the detecting ground terminal 724. In this manner, the contact of the silver pastes 8 next to each other can be prevented by disposing the plurality of grooves 512 between the detecting ground terminal 724 and the detecting signal terminal 714.

As described above, the end 512b of each of the grooves 512, the end being on the side of the vibrating body 4, is closed. Therefore, the silver paste 8 pooled within the groove 512 is prevented by this end from further flowing toward the vibrating body 4, whereby the contact between the wire disposed at the first beam 61 and the silver paste 8 is prevented, making it possible to prevent the occurrence of a short circuit between the wire and the silver paste 8.

Especially when the spaced apart distance L between the end 512b and the side surface (edge) of the first support portion 51 is from 3 μm to 35 μm as described above, the detecting ground terminal 724 and the detecting signal terminal 714 can be separated from each other more definitely. Therefore, it is possible, for example, to suppress the contact of the silver pastes 8 with each other due to the running of the silver paste 8 through a region where the groove 512 is not disposed.

Moreover, as described above, the end 512a of each of the grooves 512, the end being on the side opposite to the vibrating body, is opened in the side surface of the first support portion 51. Therefore, the detecting ground terminal 724 and the detecting signal terminal 714 are separated from each other definitely by the grooves 512, so that it is possible, for example, to prevent the contact of the silver pastes 8 with each other due to the running of the silver paste 8 through a region where the groove 512 is not disposed. Therefore, the contact of the silver pastes 8 with each other can be reliably prevented.

Moreover, by disposing the plurality of grooves 512, the following advantageous effect can also be exhibited. That is, by disposing the plurality of grooves 512, the region S4 can be made softer than the other portion, and therefore can function as a buffer portion which absorbs or relieves stress. Since the joining portion 51a with the first beam 61 included in the region S4 is a portion on which stress is likely to concentrate, the stress generated at the joining portion 51a can be effectively absorbed or relieved in the region S4. Therefore, the damage of the gyro element 2 can be effectively suppressed.

The constituent material of the gyro element 2 (the vibrating reed 3) differs from that of the bottom plate 911. Therefore, when the temperature of the vibrating device 1 rises, stress is generated in the vibrating reed 3 due to a difference in the coefficient of thermal expansion via the conductive fixing member 8. Specifically, when the coefficient of thermal expansion of the bottom plate 911 is greater than that of the vibrating reed 3, stress acting to stretch the first and second support portions 51 and 52 in the x-axis direction is applied. When the coefficient of thermal expansion of the bottom plate 911 is smaller than that of the vibrating reed 3, stress acting to contract the first and second support portions 51 and 52 in the x-axis direction is applied. Since the stresses described above can be absorbed or relieved by the region S4 where the plurality of grooves 512 are disposed, an unexpected strain of the gyro element 2 can be suppressed and a reduction in the detection accuracy of the gyro element 2 can be prevented.

In the xy plane view, it is preferable that the outline of the connection pad 10 overlaps a portion of the region S4 where the plurality of grooves 512 are disposed. With this configuration, since the plurality of grooves 512 can be used as a scale (mark), the positioning of the gyro element 2 (the vibrating reed 3) relative to the bottom plate 911 can be performed more accurately.

Second Embodiment

Next, a second embodiment of a vibrating device of the invention will be described.

Figure 8:
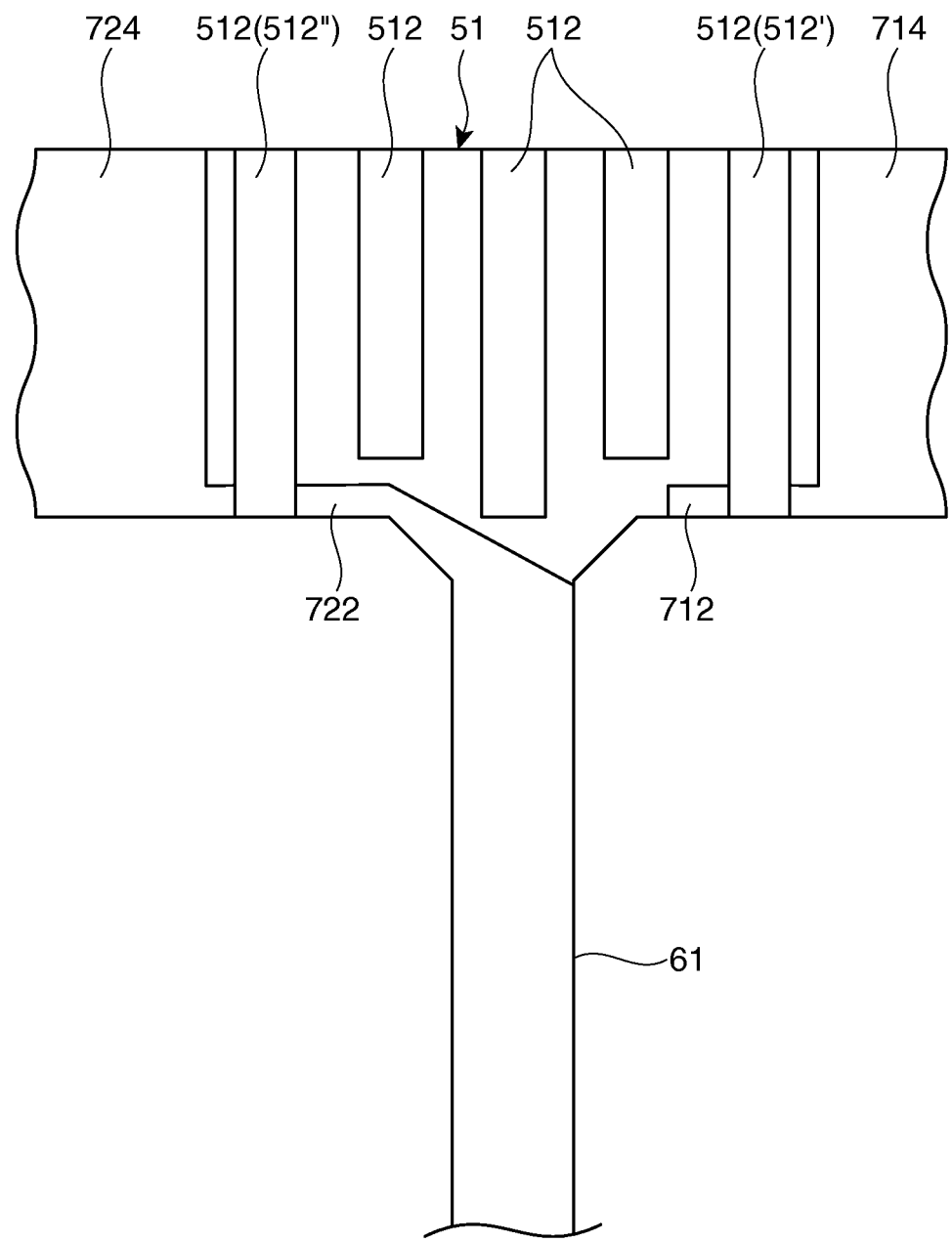
FIG. 8 is a partially enlarged view of a gyro element of a vibrating device according to a second embodiment of the invention.

FIG. 8 is a partially enlarged view of a gyro element of the vibrating device according to the second embodiment of the invention.

Hereinafter, the vibrating device of the second embodiment will be described mainly on differences from the above-described embodiment, and descriptions on similar matters are omitted.

The vibrating device according to the second embodiment of the invention is similar to that of the first embodiment described above, excepting that the configuration of grooves of the gyro element is different. Configurations similar to those of the first embodiment described above are denoted by the same reference and numeral signs. Since the plurality of grooves 512, the plurality of grooves 514, the plurality of grooves 522, and the plurality of grooves 524 have configurations similar to each other, the plurality of grooves 512 will be described below as representative of the grooves.

As shown in FIG. 8, a groove 512' of the plurality of grooves 512, the groove 512' being located on the side of the detecting signal terminal 714, has one end 512b' opened in the side surface of the first support portion 51 and being in contact with the detecting signal wire 712. A groove 512" of the plurality of grooves 512, the groove 512" being located on the side of the detecting ground terminal 724, has one end 512b" opened in the side surface of the first support portion 51 and being in contact with the detecting ground wire 722.

With the configuration described above, the detecting signal terminal 714 and the detecting ground terminal 724 can be separated from each other by the plurality of grooves 512 (particularly the grooves 512' and 512") over the entire region in the y-axis direction. Therefore, the contact of the silver pastes 8 with each other can be reliably prevented. Moreover, even if the silver paste 8 corresponding to the detecting signal terminal 714 flows into the groove 512', the silver paste 8 contacts the detecting signal wire 712, and therefore a short circuit due to the silver paste 8 does not occur. Similarly, even if the silver paste 8 corresponding to the detecting ground terminal 724 flows into the groove 512", the silver paste 8 contacts the detecting ground wire 722, and therefore a short circuit due to the silver paste 8 does not occur.

According to the second embodiment described above, advantageous effects similar to those of the first embodiment described above can be exhibited.

The vibrating device 1 described above can be incorporated into various kinds of electronic apparatuses. An electronic apparatus of the invention into which the vibrating device 1 is incorporated is not particularly limited, and can be applied to personal computers (for example, mobile personal computers), mobile terminals such as mobile phones, digital still cameras, inkjet discharge apparatuses (for example, inkjet printers), laptop personal computers, tablet personal computers, TV sets, video camcorders, videotape recorders, car navigation systems, pagers, electronic notebooks (including those with communication function), electronic dictionaries, calculators, electronic gaming machines, controllers for game, word processors, workstations, videophones, surveillance TV monitors, electronic binoculars, POS terminals, medical apparatuses (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, head-mounted displays, motion tracing, motion tracking, motion controllers, PDR (pedestrian dead reckoning), and the like.

The vibrator and the vibrating device of the invention have been described based on each of the embodiments shown in the drawings. However, the invention is not limited to them, and the configuration of each of the portions can be replaced with any configuration having a similar function. Moreover, any another component or process may be added. Moreover, the vibrating device of the invention may be one obtained by combining any two or more configurations (features) of the embodiments.

The entire disclosure of Japanese Patent Application No. 2011-251038, filed Nov. 16, 2011, is expressly incorporated by reference herein.

What is claimed is:
1. A vibrator comprising:
  a vibrating reed including a vibrating body, a support portion supporting the vibrating body, and a beam coupling the support portion with the vibrating body;
  at least two electrodes disposed at the vibrating body; and
  at least two terminals disposed at the support portion and electrically connected with the electrodes via a wire disposed at the beam, wherein
  the two terminals are arranged in parallel and spaced apart along a direction intersecting an extending direction of the beam, a plurality of grooves spaced apart along the direction intersecting the extending direction of the beam and extending along the extending direction of the beam are disposed between the two terminals, ends of the plurality of grooves are closed and are spaced apart from an edge of the support portion, and the ends of the plurality of grooves and the edge of the support portion are on a side of the vibrating body.

2. The vibrator according to claim 1, wherein
in the direction intersecting the extending direction of the beam, a connecting portion of the support portion with the beam is included in a region where the plurality of grooves are disposed.

3. The vibrator according to claim 1, wherein
at least one groove of the plurality of grooves is independently disposed.

4. The vibrator according to claim 1, wherein
ends of the plurality of grooves are opened in a side surface of the support portion, the ends being on the side opposite to the vibrating body.

5. The vibrator according to claim 1, wherein
a spaced apart distance between the ends of the grooves and the edge of the support portion is from 3 mm to 35 mm, the ends and the edge being on the side of the vibrating body.

6. The vibrator according to claim 1, wherein
an end of at least one groove of the plurality of grooves is opened in a side surface of the support portion, the end being on the side of the vibrating body.

7. The vibrator according to claim 6, wherein
an end of at least one groove of the plurality of grooves is in contact with the wire connected with one of the terminals, the end being on the side of the vibrating body, the at least one groove being located on the side of the one terminal, and an end of at least one groove is in contact with the wire connected with the other terminal, the end being on the side of the vibrating body, the at least one groove being located on the side of the other terminal.

8. The vibrator according to claim 1, wherein
the vibrating body includes a base portion, a first detecting vibration arm and a second detecting vibration arm each extending outwardly from the base portion along a first direction, a first coupling arm and a second coupling arm each extending outwardly from the base portion along a second direction perpendicular to the first direction, a first driving vibration arm and a second driving vibration arm each extending outwardly from the first coupling arm along the first direction, and a third driving vibration arm and a fourth driving vibration arm each extending outwardly from the second coupling arm along the first direction, the first detecting vibration arm and the second detecting vibration arm constituting a detecting vibration system, the first driving vibration arm, the second driving vibration arm, the third driving vibration arm, and the fourth driving vibration arm constituting a driving vibration system, the support portion includes a first support portion and a second support portion extending in the second direction and arranged to face each other along the first direction with the vibrating body interposed therebetween, the beam has a first beam passing between the first detecting vibration arm and the first driving vibration arm to couple the first support portion with the base portion, a second beam passing between the first detecting vibration arm and the third driving vibration arm to couple the first support portion with the base portion, a third beam passing between the second detecting vibration arm and the second driving vibration arm to couple the second support portion with the base portion, and a fourth beam passing between the second detecting vibration arm and the fourth driving vibration arm to couple the second support portion with the base portion, the electrodes include a first detecting signal electrode, a second detecting signal electrode, a first detecting ground electrode, and a second detecting ground electrode disposed in the detecting vibration system, and a driving signal electrode and a driving ground electrode disposed in the driving vibration system, and the terminals include a first detecting signal terminal connected with the first detecting signal electrode, a second detecting signal terminal connected with the second detecting signal electrode, a first detecting ground terminal connected with the first detecting ground electrode, a second detecting ground terminal connected with the second detecting ground electrode, a driving signal terminal connected with the driving signal electrode, and a driving ground terminal connected with the driving ground electrode.

9. A vibrating device comprising:
a substrate including at least two connection pads; and
the vibrator according to claim 1, wherein
the connection pad and the terminal are bonded together by a conductive fixing member.

10. A vibrating device comprising:
a substrate including at least two connection pads; and
the vibrator according to claim 2, wherein
the connection pad and the terminal are bonded together by a conductive fixing member.

11. A vibrating device comprising:
a substrate including at least two connection pads; and
the vibrator according to claim 3, wherein
the connection pad and the terminal are bonded together by a conductive fixing member.

12. The vibrating device according to claim 9, wherein
in a plan view of the substrate, the outline of the connection pad and a portion of a region where the plurality of grooves are disposed overlap each other.

13. The vibrating device according to claim 10, wherein
in a plan view of the substrate, the outline of the connection pad and a portion of a region where the plurality of grooves are disposed overlap each other.

14. The vibrating device according to claim 11, wherein
in a plan view of the substrate, the outline of the connection pad and a portion of a region where the plurality of grooves are disposed overlap each other.

15. An electronic apparatus comprising the vibrator according to claim 1.

16. An electronic apparatus comprising the vibrator according to claim 2.

17. An electronic apparatus comprising the vibrator according to claim 3.

* * * * *